(12) United States Patent
Gassmann et al.

(10) Patent No.: US 11,636,987 B2
(45) Date of Patent: Apr. 25, 2023

(54) SWITCH AND METHOD FOR MANUFACTURING THE SWITCH

(71) Applicant: Johnson Electric International AG, Murten (CH)

(72) Inventors: Joerg Gassmann, Dresden (DE); Felix Weidlich, Lüdenscheid (DE); Jens Penning, Dortmund (DE); Michael Doecker, Recke (DE); Jörn Brennenstuhl, Breckerfeld (DE); Alexander Kunz, Driedorf (DE); Andrea Straniero, Cusago (IT)

(73) Assignee: JOHNSON ELECTRIC INTERNATIONAL AG, Murten (CH)

( * ) Notice: Subject to any disclaimer, the term of this patent is extended or adjusted under 35 U.S.C. 154(b) by 610 days.

(21) Appl. No.: 16/673,413

(22) Filed: Nov. 4, 2019

(65) Prior Publication Data
US 2020/0144000 A1   May 7, 2020

(30) Foreign Application Priority Data

Nov. 2, 2018 (DE) .................. 10 2018 127 427.0
Nov. 2, 2018 (DE) .................. 10 2018 127 428.9

(51) Int. Cl.
| | |
|---|---|
| *H01C 1/14* | (2006.01) |
| *H01H 1/00* | (2006.01) |
| *H01C 17/065* | (2006.01) |
| *H01H 11/06* | (2006.01) |
| *G01R 31/327* | (2006.01) |
| *H01H 9/02* | (2006.01) |
| *H01C 7/02* | (2006.01) |
| *H01C 17/242* | (2006.01) |

(52) U.S. Cl.
CPC ....... *H01H 1/0015* (2013.01); *G01R 31/3274* (2013.01); *H01C 1/14* (2013.01); *H01C 7/027* (2013.01); *H01C 17/06513* (2013.01); *H01C 17/242* (2013.01); *H01H 9/02* (2013.01); *H01H 11/06* (2013.01)

(58) Field of Classification Search
CPC ........ H01H 1/0015; H01H 9/02; H01H 11/06; H01H 9/167; H01H 9/16; H01H 11/00; H01H 13/04; H01H 13/10; G01R 31/3274; H01C 1/14; H01C 7/027; H01C 17/06513; H01C 17/242; H01C 17/0652; H01C 17/06526; H01C 17/06586; H01C 7/005; H01C 10/50
See application file for complete search history.

(56) References Cited

U.S. PATENT DOCUMENTS

2004/0012478 A1* 1/2004 Taguchi ............... H01C 10/306
338/160

* cited by examiner

*Primary Examiner* — Jung Kim
(74) *Attorney, Agent, or Firm* — Aird & McBurney LP

(57) ABSTRACT

The invention relates to a switch including a switch housing, a contact system and a base disposed in the switch housing, a resistive element for diagnosing a state of a switch, and at least two terminals leading from the base. The resistive element has a specific resistance value. The resistive element is a conductive material formed on the base, the terminals being electrically connected by the conductive material.

12 Claims, 9 Drawing Sheets

SWITCH AND METHOD FOR MANUFACTURING THE SWITCH

CROSS REFERENCE TO RELATED APPLICATIONS

This non-provisional patent application claims priority under 35 U.S.C. § 119(a) from Patent Application No. 10 2018 127 427.0 filed in Germany on Nov. 2, 2018 and Patent Application No. 10 2018 127 428.9 filed in Germany on Nov. 2, 2018.

FIELD OF THE INVENTION

The invention relates to a switch and method for manufacturing the switch, specifically for a switch having a diagnostic function.

BACKGROUND OF THE INVENTION

Switches, especially micro-switches are used in large numbers for complex industrial and automotive applications, for example for switching of control currents in closure systems of motor vehicles for the purpose of scanning the position of doors, windows, trunk lids, bonnets, soft tops etc. But also seat applications, safety belts, air conditioning systems and further components of motor vehicles are monitored or controlled by using signal micro-switches.

The control currents are evaluated in the electronic control units of the vehicles. Typically, signal micro-switches only have the switching states of "ON" and "OFF" or "1" and "0", which can be read as signals by the control units. If the microprocessor of a control unit detects the "0" switching signal, this does not say anything about whether the signal micro-switch is actually in its "Off" position or rather the electrical cable connection between the terminals of the signal micro-switch and the control unit is interrupted. Particularly in technical systems under heavy mechanical stress, this uncertainty about the presence of a defect within the switch or the wiring is of great disadvantage.

The integration of the component into the switch requires high technical complexity due to the necessary miniaturization. Consequently, the construction of the switch and the mounting of components in the manufacturing process are elaborate and thus expensive. Usually, an additional printed circuit board fitted with one or more SMD resistors is disposed and wired, which evidently increases the space requirement and pushes the manufacturing costs up. Also, in most designs, only the switching state of the signal micro-switch can be detected, but not its faulty connection specifically to a control unit.

SUMMARY OF THE INVENTION

Accordingly, there is a desire for a switch with integrated circuit monitoring, which is further improved and thus more economical as compared with the prior art.

The invention relates to a switch including a switch housing, a contact system and a base disposed in the switch housing, a resistive element for diagnosing a state of a switch, and at least two terminals leading from the base. The resistive element has a specific resistance value. The resistive element is a conductive material formed on the base, the terminals being electrically connected by the conductive material.

Preferably, the resistive element is in parallel with the contact system.

Preferably, the base is a conductive plastic body formed by the conductive material as the resistive element.

Preferably, the electrically conductive plastic body uniformly forms the base to support the terminal.

Preferably, the resistive element is a conductive layer disposed on the base.

Preferably, the conductive layer is disposed on an inner side and/or an outer side of the base.

Preferably, the terminals are each formed of a continuous stamped part.

Preferably, resistivity of the conductive material forming the resistive element is adjusted by a concentration of additive of the conductive material.

Preferably, the additive is one or more of conductive soot, carbon, graphite, carbon fiber, stainless steel fiber, copper, aluminum.

Preferably, the conductive material forming the resistive element is an intrinsically electrically conductive polymer.

Preferably, a geometry of the conductive material forming the resistive element defines a resistance value of the resistive element.

Preferably, a resistance value of the resistive element is calibrated by laser trimming or ablation.

Preferably, resistance values of the resistive elements between the different terminals are different.

Preferably, the base is provided with one or more recesses for receiving the conductive layer.

According to a second aspect of the invention, there is provided a method for manufacturing a switch having at least two terminals, the method includes the step of achieving a mechanical connection and an electrical connection between the at least two terminals by overmolding the at least two terminals with a conductive plastic body of a defined electrical resistivity in an injection molding process.

Preferably, the conductive plastic body forms a base of the switch.

Preferably, a resistance value of the conductive plastic body is calibrated by laser trimming or ablation.

According to a third aspect of the invention, there is provided a method for manufacturing a switch having at least two terminals and a base, the method comprising the step of achieving an electrical connection between the at least two terminals by laying at least one conductive layer on the base between the at least two terminals.

Preferably, the conductive layer is sprayed between the terminals through a nozzle or printed by a suitable printer.

Preferably, the conductive layer is dried or cured after being laid and the a resistance value of the conductive layer is calibrated by laser trimming or ablation.

Below, embodiments of the present disclosure will be described in detail with reference to the accompanying drawings.

BRIEF DESCRIPTION OF THE DRAWINGS

FIG. 4b is a schematic view with the receiving groove in FIG. 4a.

The following implementations are used for the description of the present disclosure in conjunction with above Figures.

DETAILED DESCRIPTION OF THE PREFERRED EMBODIMENTS

The technical solutions of the embodiments of the present invention will be clearly and completely described as follows with reference to the accompanying drawings. Apparently, the embodiments as described below are merely part of, rather than all, embodiments of the present invention. Based on the embodiments of the present invention, any other embodiment obtained by a person skilled in the art without paying any creative effort shall fall within the protection scope of the present invention.

It is noted that, when a component is described to be "fixed" to another component, it can be directly fixed to the another component or there may be an intermediate component. When a component is described to be "connected" to another component, it can be directly connected to the another component or there may be an intermediate component. When a component is described to be "disposed" on another component, it can be directly disposed on the another component or there may be an intermediate component.

Unless otherwise specified, all technical and scientific terms have the ordinary meaning as commonly understood by people skilled in the art. The terms used in this disclosure are illustrative rather than limiting. The term "and/or" used in this disclosure means that each and every combination of one or more associated items listed are included.

Figure 1A:
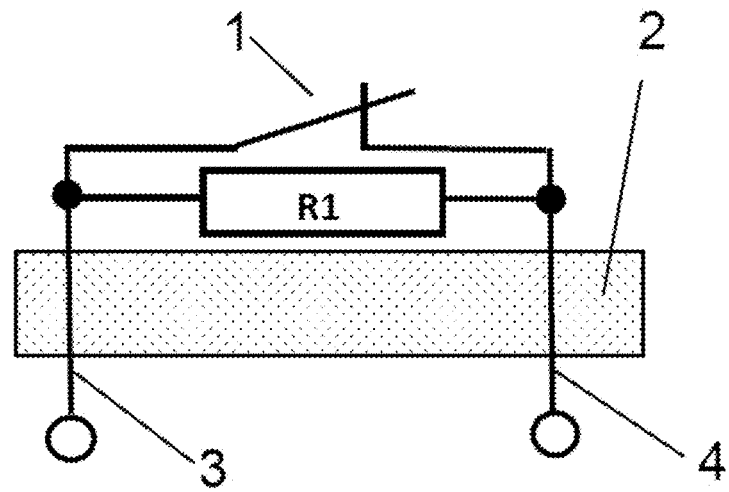
FIG. 1a is a perspective view of a switch with two terminals according to the prior art.

FIG. 1a shows a switch of a prior art having a contact system 1 and two terminals 3, 4 leading from a base 2, the two terminals 3, 4 are electrically connected via a high resistance resistor. In the example, two contacts of the contact system 1 are shown closed. If this is the normal position of the contact system 1, the switch is a normally closed contact. In contrast, if this is the working position, the switch is a normally open contact. Here, a diagnostic device e.g. for a motor vehicle, not shown, can detect three states:

The resistance value across both terminals 3, 4 is 0, the contacts of the contact system 1 are thus closed. There is no fault.

The resistance value across both terminals 3, 4 is equal to the resistance value of the resistor R1. The contacts of the contact system 1 are thus open. There is no fault.

The resistance value across both terminals 3, 4 is infinitely large. There is a fault in the supply line or in the contacting of the switch.

Figure 1B:
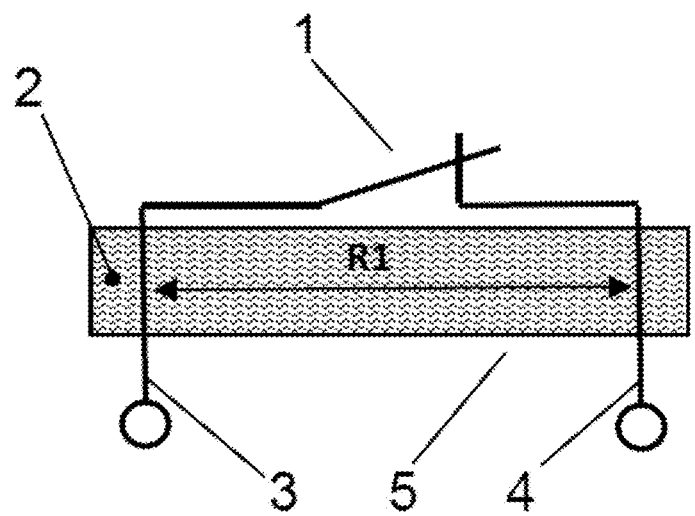
FIG. 1b is a perspective illustration of a switch with two terminals according to a first embodiment of the present invention.

According to FIG. 1b, the resistor R1 could be replaced by a conductive plastic body 5. In at least one embodiment, the conductive plastic body 5 equally forms the base 2 of the whole switch. The resistance value of the conductive plastic body 5 according to FIG. 1b can be equivalent to the resistance value of the resistor R1 according to FIG. 1a, for example.

From an electrical viewpoint, there are thus no differences between a solution according to FIG. 1a and FIG. 1b. However, this makes the manufacture of the switch significantly cheaper because both manufacturing costs and material costs can be saved if the terminals 3, 4 are embedded in a base 2 made of a conductive plastic body 5 instead of a conventional base 2 and because this body equally replaces the resistor R1. In addition, the switch can be miniaturized further because the installation space for the resistor and, a printed circuit board, if applicable, is eliminated.

It will be appreciated, that intrinsically electrically conductive polymers or polymers admixed with additives may be used as conductive and preferably injection-mouldable plastic materials. According to the additive concentration, a desired resistivity value can be set. Additives to be considered are conductive soot, carbon, graphite, carbon fibres, stainless steel fibres, copper or aluminium.

Figure 1C:
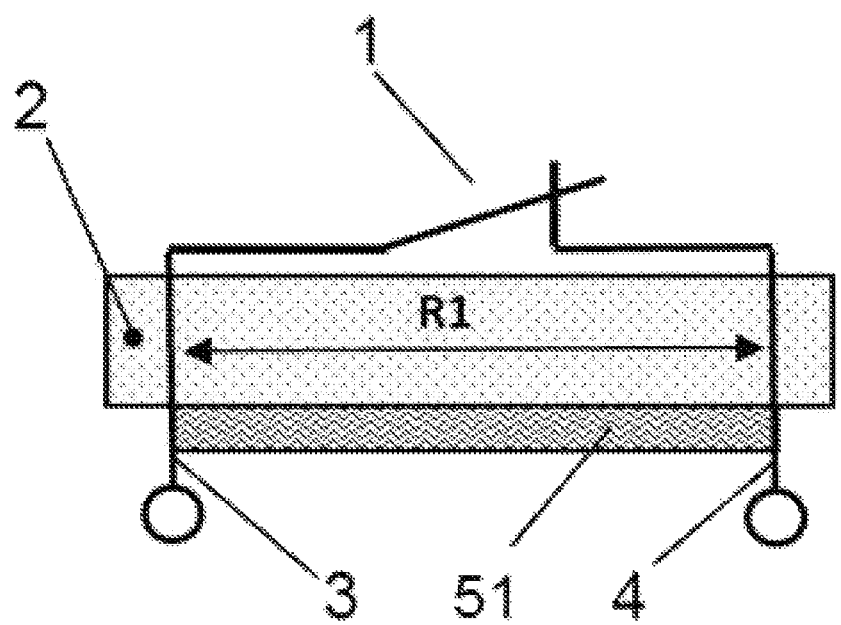
FIG. 1c is a perspective illustration of a switch with two terminals according to a second embodiment of the present invention.

According to FIG. 1c, the resistor R1 is replaced by an electrically conductive layer 51 formed by electrically conductive material, with the conventional switch base 2 being formed as usual. The electrically conductive layer 51 forms the specific resistor and is applied protrudingly on the outside of the switch base 2 between the two terminal 3, 4 and conductively connected with terminal 3, 4. The resistance value of the electrically conductive layer 51 may be equivalent to the resistance value of the resistor R1 according to FIG. 1a, for example.

From an electrical viewpoint, there are thus no differences between a solution according to FIG. 1a and FIG. 1c. However, the manufacture of the switch will be significantly cheaper because manufacturing costs and material costs can be saved if the resistor R1 is replaced in this way. In addition, the switch can be miniaturized further because the installation space for the resistor and, if applicable, its printed circuit board is eliminated.

Intrinsically electrically conductive polymers or polymers admixed with additives may be used as electrically conductive layer 51. According to the additive concentration, a desired resistivity value can be set. Additives to be considered are conductive soot, carbon, graphite, carbon fibres, stainless steel fibres, copper or aluminium.

Figure 2A:
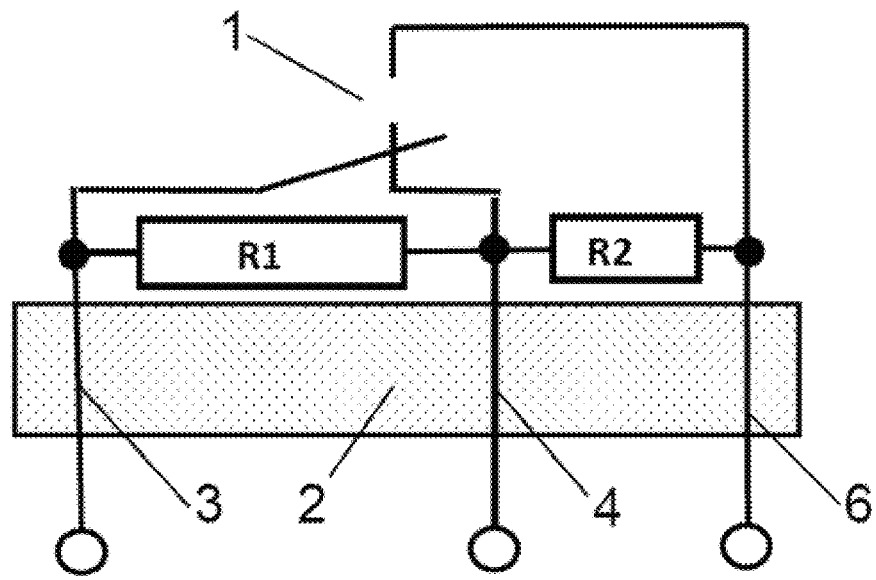
FIG. 2a is a perspective view of a switch with three terminals according to the prior art.

FIG. 2a shows a known switch with a contact system 1 and three electrical terminals 3, 4, 6 guided out of the base 2, of which two terminals 3, 4 are electrically connected via a high-resistance resistor R1 and the second terminal 4 is electrically connected with the third terminal 6 via a second high-resistance resistor R2. The contact system 1 is shown as a changeover contact. A diagnostic device not shown, e.g. for a motor vehicle, can here detect the following states:

The resistance value across both terminals 3, 4 is 0, the contact system 1 is thus closed by a lower switch position of the changeover contact. There is no fault.

The resistance value across the two terminals 3, 4 is equal to the resistance value of the resistor R1. The lower contact of the contact system 1 is thus open. The contact system 1 of the changeover contact has switched over. There is no fault.

The resistance value across the two terminals 3, 4 is infinitely large. There is a fault in the supply line or in the contacting of the switch.

The resistance value across both terminals 3, 6 is 0, the contact system 1 is thus closed by an upper switch position of the changeover contact. There is no fault.

The resistance across the two terminals 3, 6 is equal to the resistance value of the resistor R2. The contact system 1 is thus closed by the lower switch position, the changeover contact has switched over. There is no fault.

The resistance across the two terminals 3, 6 is infinitely large. There is a fault in the supply line or in the contacting of the switch.

Figure 2B:
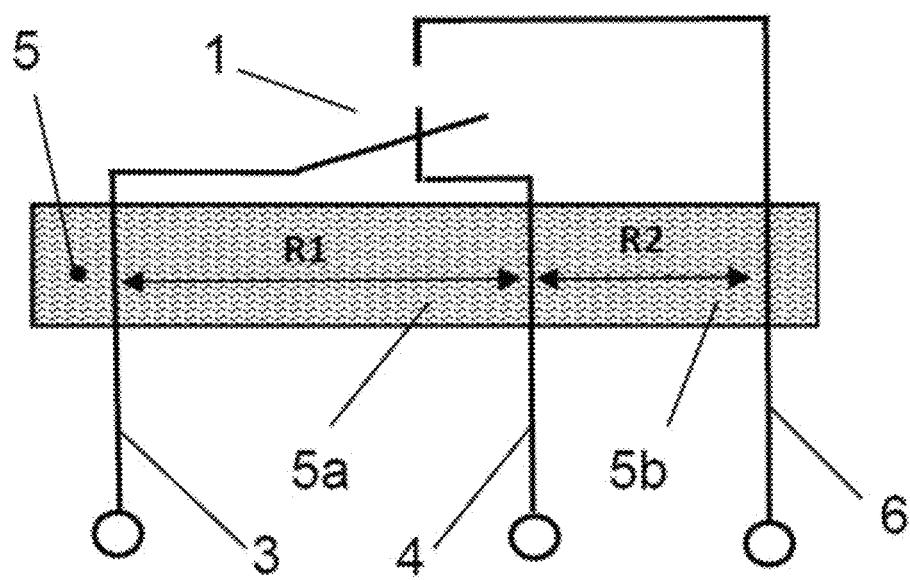
FIG. 2b is a perspective illustration of a switch with three terminals according to a first embodiment of the present invention.

According to FIG. 2b, the resistors R1 and R2 are replaced by a conductive plastic body 5 that equally forms the base 2. For example, the resistance value of the conductive plastic body 5 according to FIG. 2b between the electrical terminals 3, 4 may be equivalent to the resistance value of the resistor R1 according to FIG. 2a and the resistance value between the electrical terminals 4, 6 may be equivalent to the resistance value of the resistor R2 according to FIG. 2a.

From an electrical viewpoint, there are thus no differences between a solution according to FIG. 2a and FIG. 2b. However, the manufacture of the switch will be significantly cheaper because manufacturing costs and material costs can be saved if the electrical terminals 3, 4 and 6 are embedded in a base 2 made of a conductive plastic body 5 instead of a conventional base 2, wherein this body equally replaces the resistors R1 and R2. In addition, the switch can be miniaturized further because the installation space for the resistors R1, R2 and, if applicable, their printed circuit board is eliminated.

The resistance values of the resistors R1 and R2 may differ by their different distance and the conductance within the conductive plastic body 5. The conductive plastic body 5 may also be designed in segments. The segments 5a and 5a may consist of different mixtures or be applied as an additional layer of a conductive plastic material.

Figure 2C:
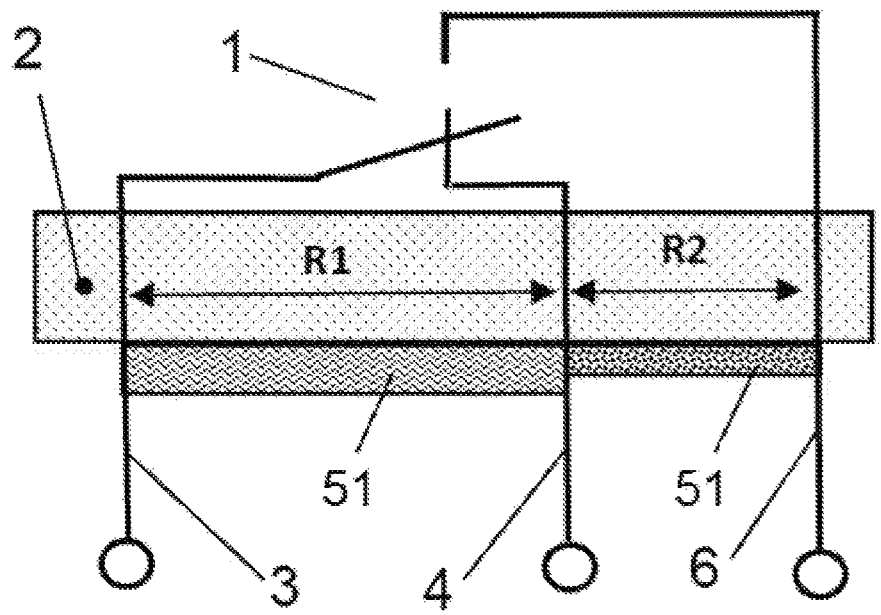
FIG. 2c is a perspective illustration of a switch with three terminals according to a second embodiment of the present invention.

According to FIG. 2c, the resistors R1 and R2 are replaced by electrically conductive layers 51 formed by electrically conductive material. Here, these are applied directly on the outside of the switch base 2 between the terminals 3, 4, 6. For example, the resistance value of the electrically conductive layers 51 according to FIG. 2c between the electrical terminals 3 and 4 may be equivalent to the resistance value of the resistor R1 according to FIG. 2a and the resistance value between the electrical terminals 4 and 6 may be equivalent to the resistance value of the resistor R2 of FIG. 2a.

From an electrical viewpoint, there are thus no differences between a solution according to FIG. 2a and FIG. 2c. However, the manufacture of the switch will be significantly cheaper because manufacturing costs and material costs can be saved. In addition, the switch can be miniaturized further because the installation space for the resistors R1, R2 and, if applicable, their printed circuit board is eliminated. The resistance values of the resistors R1 and R2 can visibly differ in their different thickness or width of the application, i.e. the conductance within the electrically conductive layer 51 can easily be set by different layer thicknesses or widths or by different materials applied, respectively. However, referring to FIG. 5 together, it can be understood that it is also possible to apply the electrically conductive layer 51 inside the switch housing 18 on the inner surface of the switch base 2. The resistors are thus protected against mechanical damage and climatic influences.

Figure 2D:
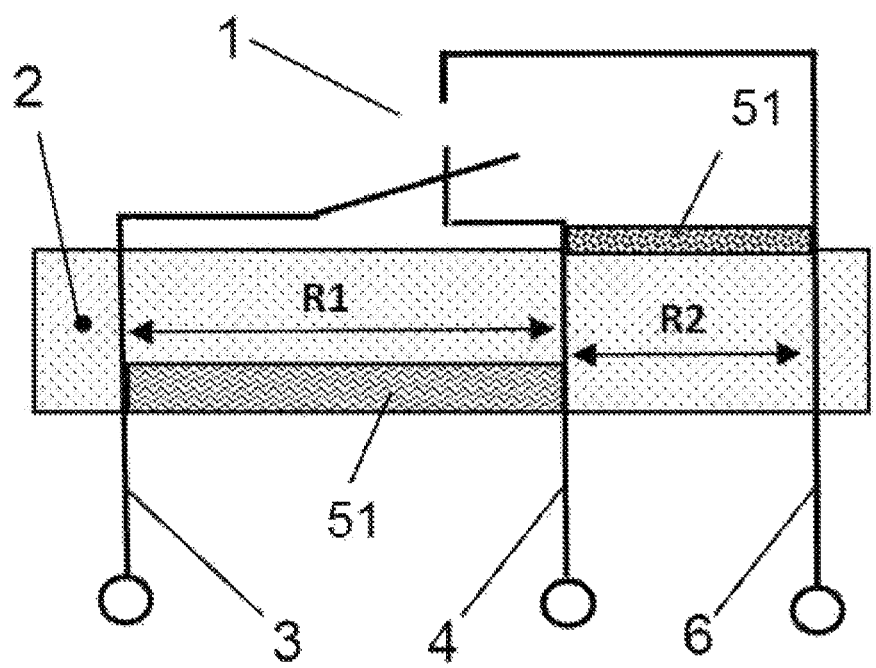
FIG. 2d is a perspective illustration of a switch with three terminals according to a third embodiment of the present invention.

FIG. 2d schematically shows a similar switch with three terminal 3, 4, 6 and resistors R1 and R2 applied differently inside and outside. The electrically conductive layer 51 with the desired resistive properties is protrudingly applied directly on the inside of the switch base 2 on the surface between the electrical terminal 4 and 6, while between terminal 3 and 4 it is applied on the outside of the switch base, i.e. outside the switch housing 18 in a recess of the switch base 2. This has the advantage that the electrically conductive layer 51 with its required resistive properties is protected against mechanical damage during installation, for example. Likewise, application only on the outside in a continuous recess or in two separate recesses is possible.

Figure 2E:
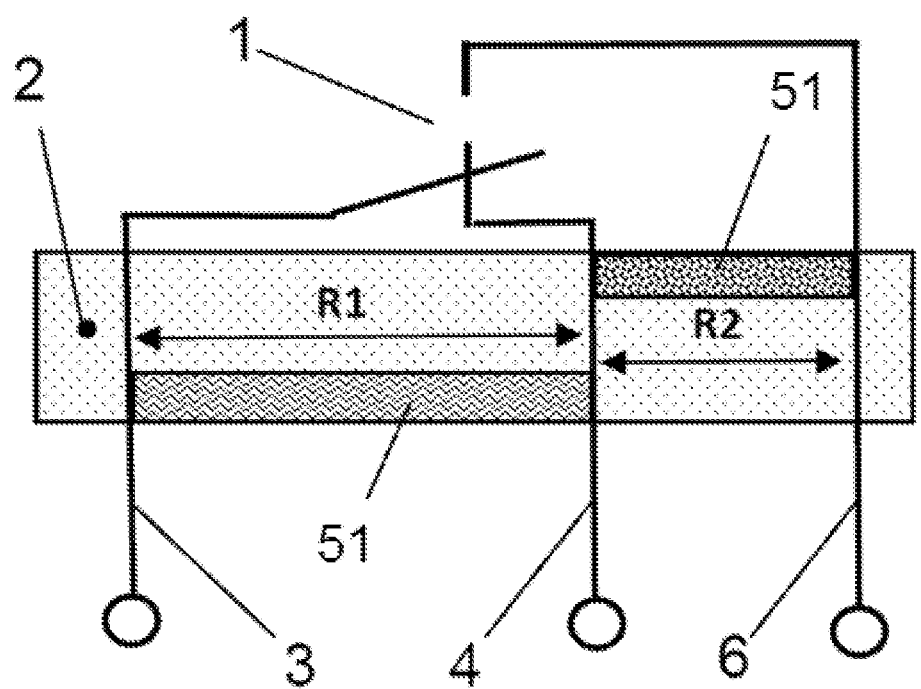
FIG. 2e is a perspective illustration of a switch with three terminals according to a fourth embodiment of the present invention.

FIG. 2e schematically shows a further embodiment of a similar switch, where the electrically conductive layer 51 with resistive properties is inserted between the terminal 3 and 4 on the outside in a recess of switch base 2 and between the electrical terminal 4 and 6 on the inside in a recess of switch base 2. This has advantages, specifically in terms of mechanical protection of the resistive materials. In addition, for example, the flowing away of pasty resistive materials is excluded.

Figure 3:
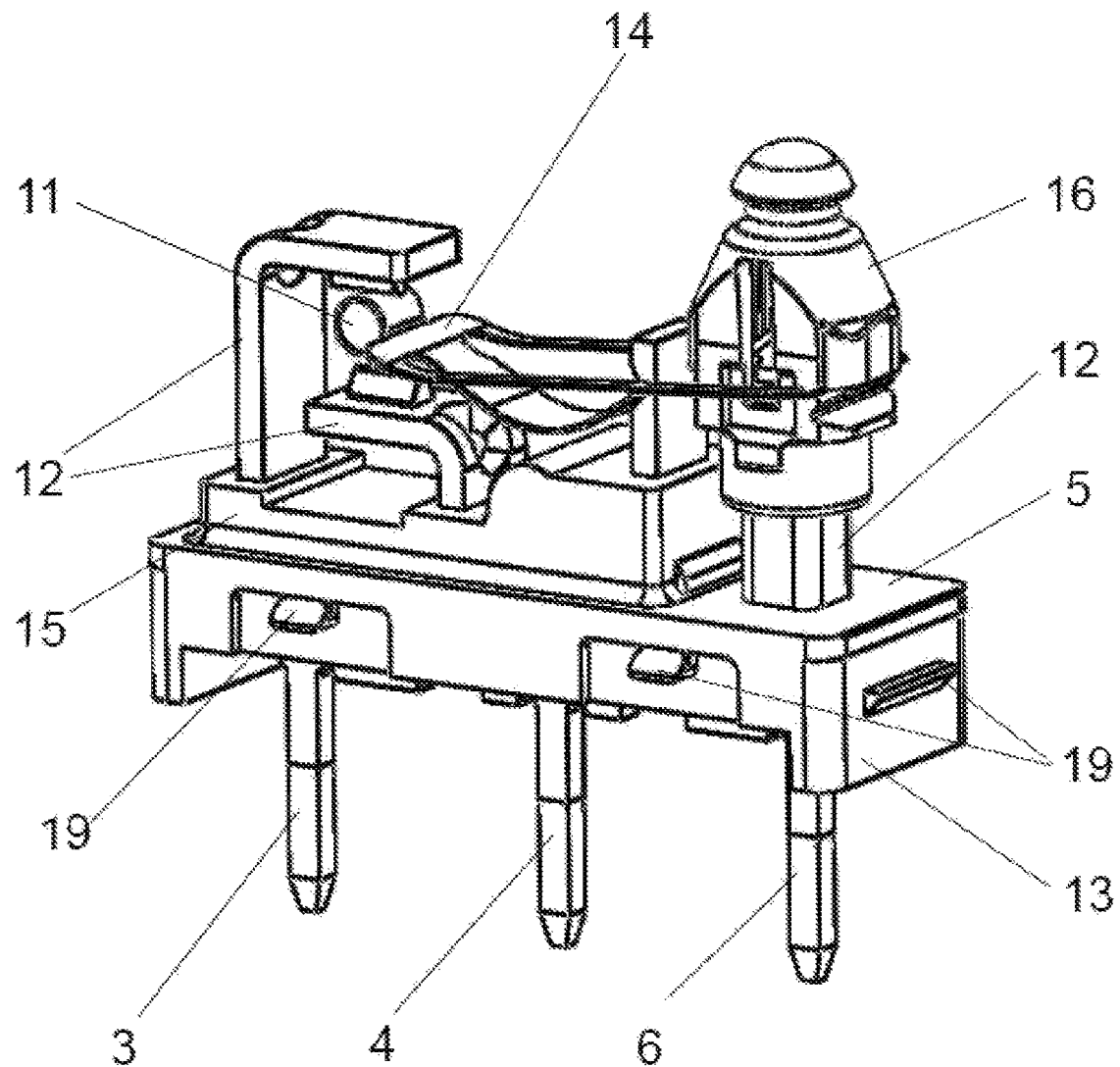
FIG. 3 is a schematic view of the switch of FIG. 2b.

FIG. 3 shows the interior of the switch according to the invention of FIG. 2b. Wherein, reference numerals 13 and 2 both indicate the base of the switch, and reference numerals 12 and 3, 4, and 6 all indicate the terminals of the switch.

The three electrical terminals 3, 4, 6 of the switch are made of simple stamped parts guided through a base 13 and supported in the holding body 15. A spring 14 is guided in a notch of a raised part of the electrical terminal 6 with a bent pre-loaded tongue such that this tongue is switchable like a rocker. In at least one embodiment, the spring 14 is a metal spring. The metal spring 14 is braced with the actuator 16 by means of a peripheral bracket part for actuating the switching movement. The actuator 16 can also be designed with a helical spring for additional spring load. The switching end of the metal spring 14 has bent contact member 11 as movable switching contact. Depending on the switch position, these are in contact with one of the corresponding fixed switch contacts of the two terminals 3 and 4. The actuator 16 acts like a tappet that switches the metal spring under applied load from the open position into a closed switch position. The tappet is sealed against the switch housing 18 by means of a rubber bellow 17. The metal spring 14 does not only form the movable switch contact member 11 of the contact system but also provides the reset force of the actuator 16. Actuation of the actuator 16 thus interrupts the electrical contact between the upper switching end of the metal spring 14 and the fixed switch contact member 11, with the switch assuming its open position.

Evidently, the space of the switch is confined and, in the interest of a cost reduction, it is desirable to be able to replace the circuit resistor between the terminals 12. The invention provides this by the base 13 itself assuming the function of a circuit resistor, wherein the base 13 is made of an electrically conductive plastic material with a defined specific electrical resistance. From an electrical viewpoint, the base 13, and thus the circuit resistor, is parallel to the switch path. Of course, the electrical terminals 12 must not only be mechanically secured in the base 13, but also have intensive electrical contact with the conductive plastic body. By using an adapted injection moulding process, the base 13 can be produced fast and easily in the required dimensional accuracy and be designed with the required circuitry resistance value.

Figure 4A:
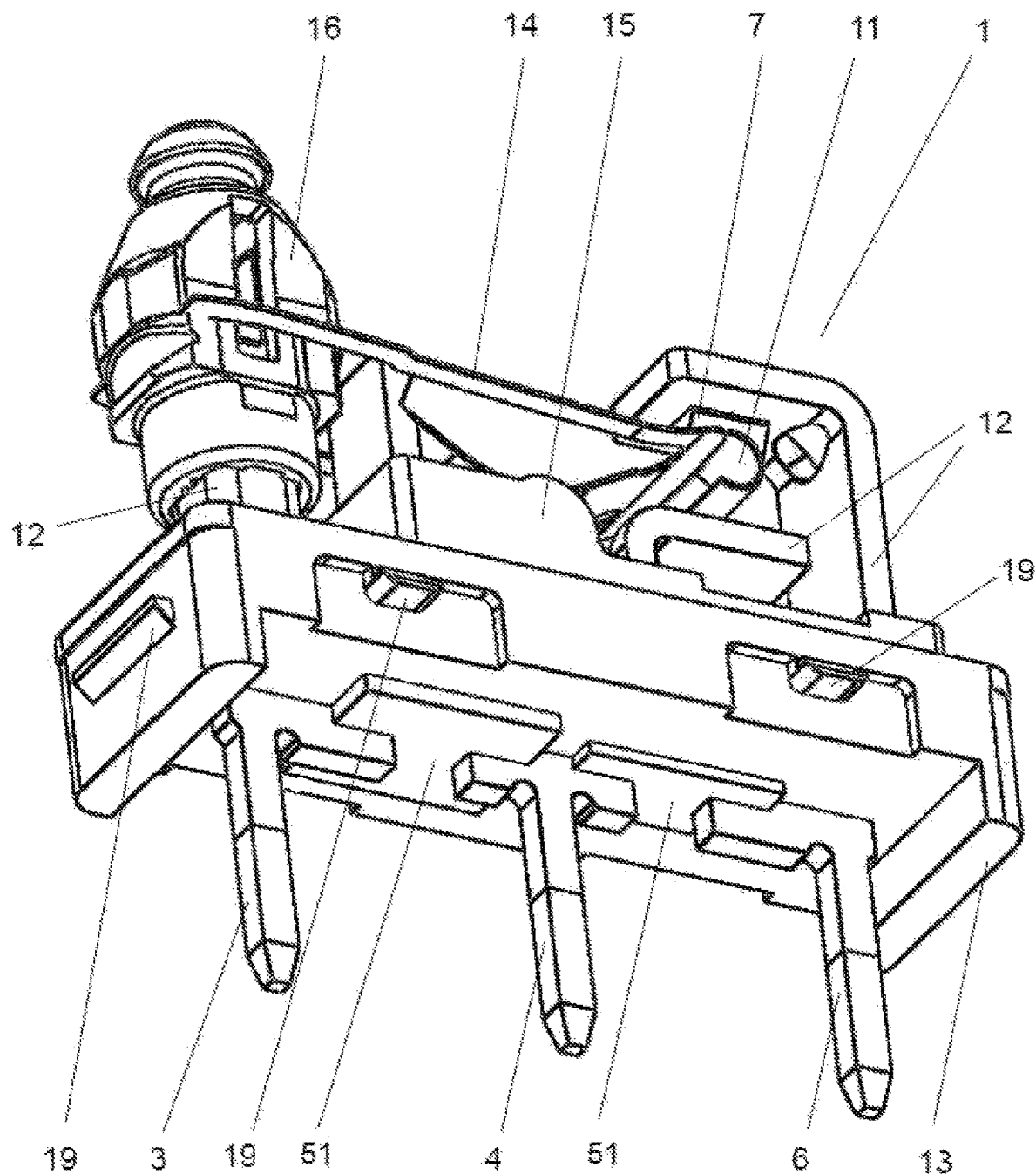
FIG. 4a is a schematic view of the switch of FIG. 2c.

FIG. 4a shows an inner structure of a switch with electrically conductive layers 51 made of electrically conductive material protrudingly applied on the outside of the switch base 13, here for example formed as two printed outside material blocks, and disposed between the terminals 3, 4, 6. The three terminals 12 are formed as continuous stamped parts, and the terminals 4 and 6 are bent inside such that they form the switch contacts of the contact system 1. Contacts 7 are fastened to the bent switch contacts inside towards the contact member 11. The terminals 12 are firmly potted into the switch base 13 and the switching system is held by a holding body 15. The spring 14 is held and guided on the holding body 15 such that the contact member 11 can contact the respective switch contacts. The spring 14 is actuated by means of the actuator 16 and switched by its springy properties. If the actuator 16 is relaxed, i.e. no force acting on it, the contact system 1 is switched back and the terminals 3 and 4 are connected. The actuator 16 is guided and supported in a spring-loaded manner on terminal 3, a continuously formed terminal 12.

Both narrow sides of the switch base 13 have each one fastening lug 19 and the long sides of the switch base 13 have each two fastening lugs 19. These fastening lugs 19 position the switch housing 18, which is designed as a plug-on housing cap 18. To make secure contact with the electrically conductive layer 51 with the required resistive properties, the terminals have additional terminal shoulders reaching somewhat over the electrically conductive layers 51.

Figure 4B:
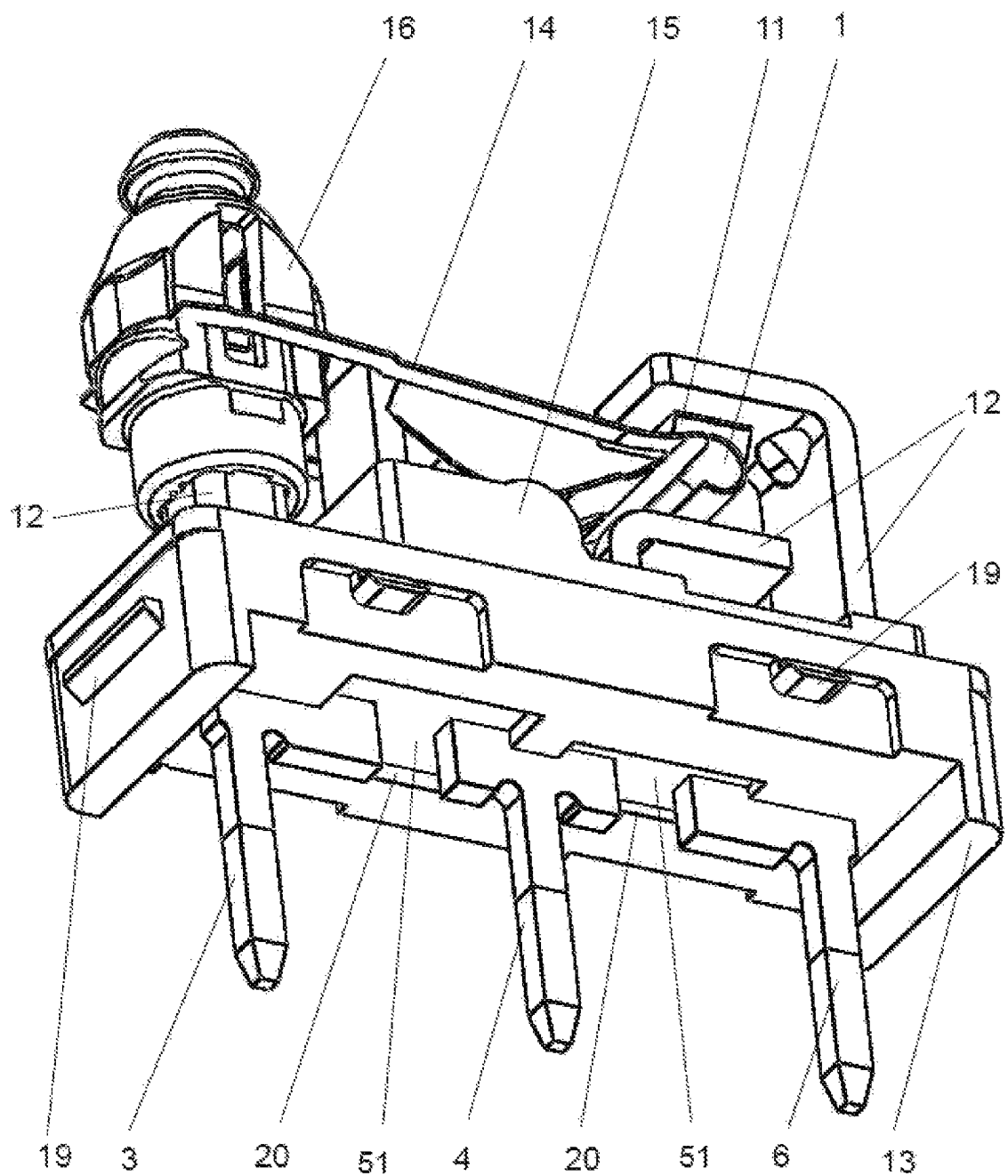

FIG. 4b shows the inner structure of a switch, wherein recesses 20 are introduced outside in the bottom of the switch base 13, into which the electrically conductive layer 51 with the respective resistive properties is introduced. The further structure is identical with the embodiment described in FIG. 4a.

Figure 5:
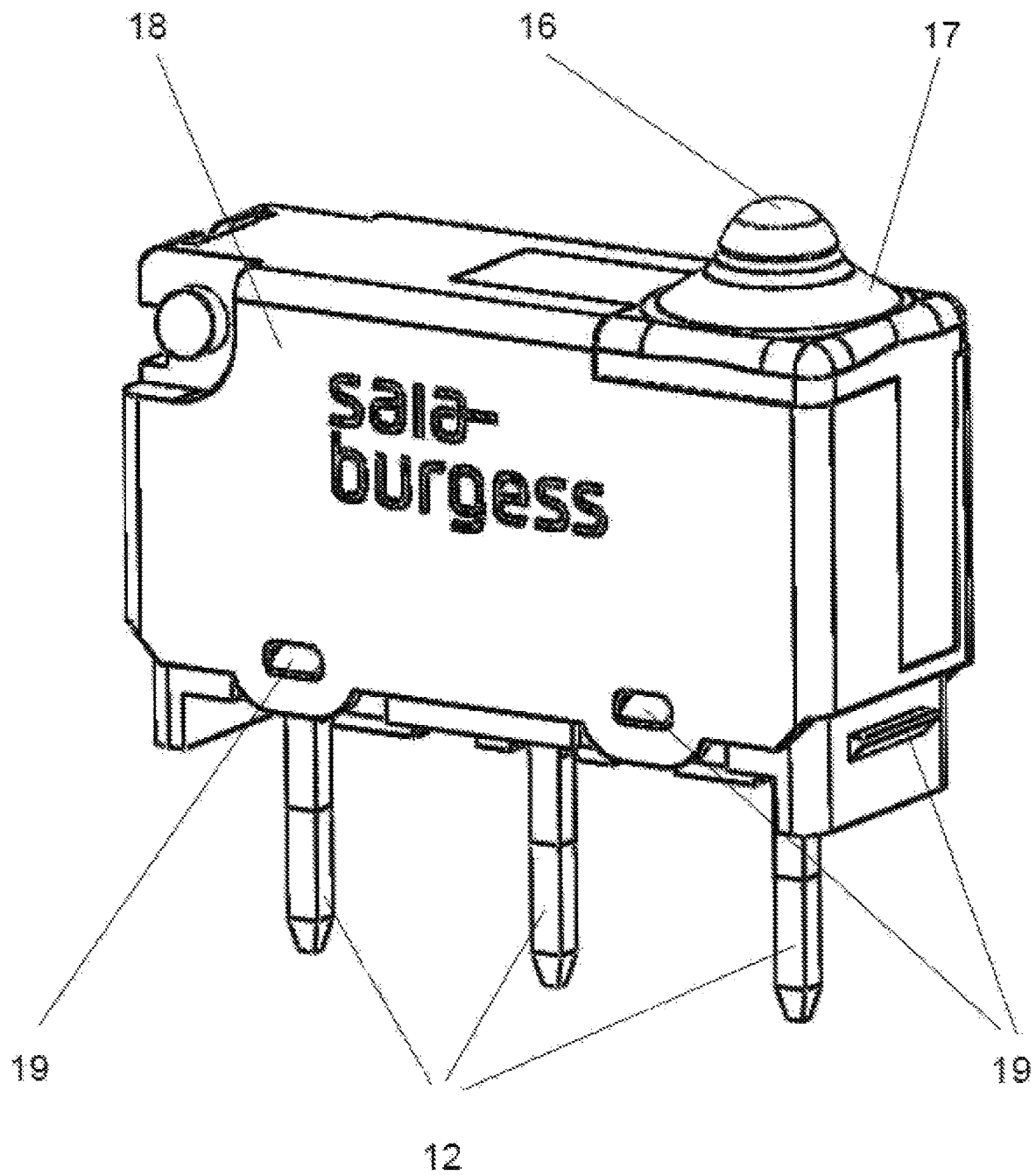
FIG. 5 is an overall schematic view of the switch of the present invention.

FIG. 5 shows the outside of switch with three terminals 12. This changeover switch shows the compact construction of such a switch according to the invention, wherein the three terminals are connected to each other with conductive plastic body 5 as base 13 or electrically conductive layers 51 on the base 13 with specially dimensioned resistive properties. The switch housing 18 is held and positioned by the fastening lugs 19 on the long side. The fastening lugs 19 on the narrow side are for fastening to the respective support part, into which the switch is to be inserted. The actuator 16 which is switchable under spring load is guided through the switch housing 18 to the outside and its actuating button is sealed against the switch housing with a rubber bellow 17.

This switch is usable for complex industrial and specifically automotive applications. The switch performs reliable circuit monitoring, and this switch can additionally be evaluated in a voltage-coded manner if used in conjunction with a suitable control device. An advantage is the reduced expense of components, the small required space, and the manufacturing effort can also be reduced as compared with the known prior art. Thus, in total, the switch can be manufactured significantly more economically.

An example of a suitable conductive plastic body 5 or electrically conductive layers 51 with adjustable resistive properties may be the following material: polypropylene with an electrical resistivity of $2.4 \times 10^6$ ohms mm$^2$/m, i.e. resulting in approx. 1 kohm between the terminal pins. The preferred resistance values of the one resistor are about 1 kΩ, those of the other resistor are about 10 kΩ, for example.

It will be understood that the switching mechanism and the switching function of the switch is not limited to the described embodiment, but deviations in the construction and operation of the switch are within the scope of protection of the invention.

The invention further relates to a method for producing a switch, specifically a diagnosable switch. According to this method, at least two terminals 3, 4 and/or 6 are potted together with an electrically conductive plastic body in the form of a base 2 or support for the switch, which plastic body forms/replaces the resistor R1 or the resistors R1, R2 between the terminals 3, 4, 6. Advantageously, a suitable injection moulding process is selected for potting.

Alternatively, the at least one conductive layer 51 is laid between the at least two terminals 3, 4 and/or 6 on the base 2 such that the terminals are electrically connected. The conductive layer 51 is used to form the resistor R1 or the resistors R1, R2 between the terminals 3, 4, 6.

The conductive layer 51 is sprayed between the terminals through a nozzle or printed between the terminals by a suitable printer. If desired, the conductive layer 51 is dried or cured after being laid.

In a further development of the method, the resistance values of the electrically conductive plastic body 5 or the conductive layer 51 are posteriorly calibrated, e.g. by means of laser trimming or another suitable mechanical material ablation, in order to create defined electrical resistors to allow attribution by the control unit.

The above embodiments are merely to illustrate the technical solutions of the present invention and are not intended to limit the present invention. Although the present invention has been described with reference to the above preferred embodiments, it should be appreciated by those skilled in the art that various modifications and variations may be made without departing from the spirit and scope of the present invention.

The invention claimed is:

1. A switch, comprising:
   a switch housing;
   a contact system and a base disposed in the switch housing;
   a resistive element for diagnosing a state of a switch, the resistive element having a specific resistance value; and
   at least two terminals leading from the base;
   wherein the resistive element is constituted by a conductive material formed on the base, the terminals being electrically connected by the conductive material directly,
   wherein the base is a conductive plastic body formed by the conductive material as the resistive element.

2. The switch of claim 1, wherein the resistive element is in parallel with the contact system.

3. The switch of claim 1, wherein the electrically conductive plastic body uniformly forms the base to support the terminal.

4. The switch of claim 1, wherein the terminals are each formed of a continuous stamped part.

5. The switch of claim 1, wherein resistivity of the conductive material forming the resistive element is adjusted by a concentration of additive of the conductive material.

6. The switch of claim 5, wherein the additive is one or more of conductive soot, carbon, graphite, carbon fiber, stainless steel fiber, copper, aluminum.

7. The switch of claim 1, wherein the conductive material forming the resistive element is an intrinsically electrically conductive polymer.

8. The switch of claim 1, wherein a geometry of the conductive material forming the resistive element defines a resistance value of the resistive element.

9. The switch of claim 1, wherein a resistance value of the resistive element is calibrated by laser trimming or ablation.

10. The switch of claim 1, wherein resistance values of the resistive elements between the different terminals are different.

11. A switch, comprising:
a switch housing;
a contact system and a base disposed in the switch housing;
a resistive element for diagnosing a state of a switch, the resistive element having a specific resistance value; and
at least two terminals leading from the base;
wherein the resistive element is a conductive layer disposed on the base, the terminals being electrically connected by the conductive layer directly;
wherein the base is provided with one or more recesses for receiving the conductive layer.

12. The switch of claim 11, wherein the conductive layer is disposed on an inner side and/or an outer side of the base.

* * * * *